(12) United States Patent
Kruijt-Stegeman et al.

(10) Patent No.: US 7,641,467 B2
(45) Date of Patent: Jan. 5, 2010

(54) IMPRINT LITHOGRAPHY

(75) Inventors: Yvonne Wendela Kruijt-Stegeman, Eindhoven (NL); Raymond Jacobus Wilhelmus Knaapen, Helmond (NL); Raymond Wilhelmus Louis Lafarre, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 343 days.

(21) Appl. No.: 11/797,357

(22) Filed: May 2, 2007

(65) Prior Publication Data

US 2008/0271628 A1 Nov. 6, 2008

(51) Int. Cl.
*B29C 59/00* (2006.01)
(52) U.S. Cl. ...................... 425/385; 264/293
(58) Field of Classification Search ............... 425/385; 264/293
See application file for complete search history.

(56) References Cited

U.S. PATENT DOCUMENTS

| | | | |
|---|---|---|---|
| 4,731,155 A | 3/1988 | Napoli et al. | 156/643 |
| 5,772,905 A | 6/1998 | Chou | 216/44 |
| 6,180,239 B1 | 1/2001 | Whitesides et al. | 428/411.1 |
| 6,334,960 B1 | 1/2002 | Willson et al. | 216/52 |
| 6,416,311 B1 | 7/2002 | Springer et al. | 425/385 |
| 2004/0011231 A1 | 1/2004 | Hall et al. | 101/327 |
| 2004/0124566 A1 | 7/2004 | Sreenivasan et al. | 264/494 |
| 2005/0274693 A1 | 12/2005 | Heidari et al. | 216/52 |
| 2006/0145400 A1 | 7/2006 | Colburn et al. | 264/494 |
| 2006/0231979 A1 | 10/2006 | Santen et al. | 264/319 |
| 2007/0018358 A1 | 1/2007 | Heidari et al. | 264/334 |

FOREIGN PATENT DOCUMENTS

| | | |
|---|---|---|
| KR | 10-2005-0072196 | 7/2005 |
| WO | WO 02/067055 A2 | 8/2002 |
| WO | WO 02/067055 A3 | 8/2002 |

OTHER PUBLICATIONS

J. Haisma, "Mold-assisted nanolithography: A process for reliable pattern replication", J. Vac. Sci. Technol. B14(6), Nov/Dec 1996, pp. 4124-4128.

*Primary Examiner*—Maria Veronica D Ewald
(74) *Attorney, Agent, or Firm*—Pillsbury Winthrop Shaw Pittman LLP (57) ABSTRACT

An imprint lithography apparatus includes an imprint template operably connected to an imprint actuator. The imprint actuator is actuatable to displace the template along an imprint axis to bring the template into contact with an imprintable medium. The template is connected to the actuator via a bearing configured to permit substantially unrestricted displacement of the actuator relative to the template along an axis substantially perpendicular to the imprint axis during release of the template from the imprintable medium.

18 Claims, 8 Drawing Sheets

IMPRINT LITHOGRAPHY

FIELD

The present invention relates to imprint lithography.

BACKGROUND

In lithography, there is an ongoing desire to reduce the size of features in a lithographic pattern to increase the density of features on a given substrate area. In photolithography, the push for smaller features has resulted in the development of technologies such as immersion lithography and extreme ultraviolet (EUV) lithography, which are somewhat costly.

A potentially less costly road to smaller features that has gained increasing interest is so-called imprint lithography, which generally involves the use of a "stamp" to transfer a pattern onto a substrate. One feature of imprint lithography is that the resolution of the features is not limited by, for example, the wavelength of a radiation source or the numerical aperture of a projection system as in photolithography, but may be limited by the pattern density on the stamp (also referred to as template). There are three main approaches to imprint lithography, examples of which are schematically depicted in FIGS. 1a to 1c.

Figure 1A:
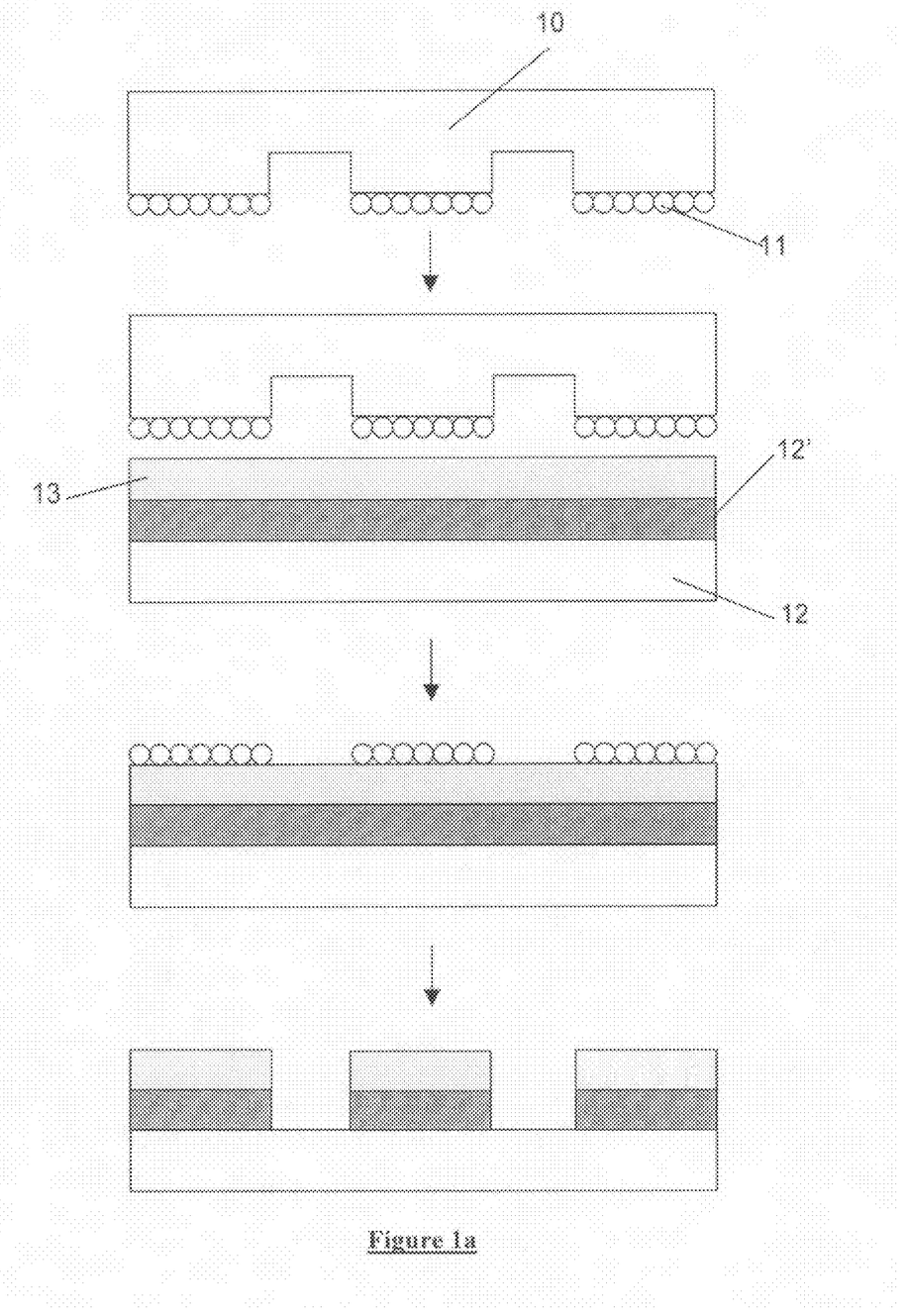
FIG. 1*a* schematically shows an example of micro-contact printing imprint lithography.

FIG. 1a shows an example of a type of imprint lithography that is often referred to as micro-contact printing. Micro-contact printing involves transferring a layer of molecules 11 (typically an ink such as a thiol) from a template 10 (e.g. a polydimethylsiloxane template) onto a resist layer 13 which is supported by a substrate 12 and planarization and transfer layer 12'. The template 10 has a pattern of features on its surface, the molecular layer being disposed upon the features. When the template is pressed against the resist layer, the layer of molecules 11 are transferred onto the resist. After removal of the template, the resist is etched such that the areas of the resist not covered by the transferred molecular layer are etched down to the substrate. For more information on micro-contact printing, see e.g., U.S. Pat. No. 6,180,239.

Figure 1B:
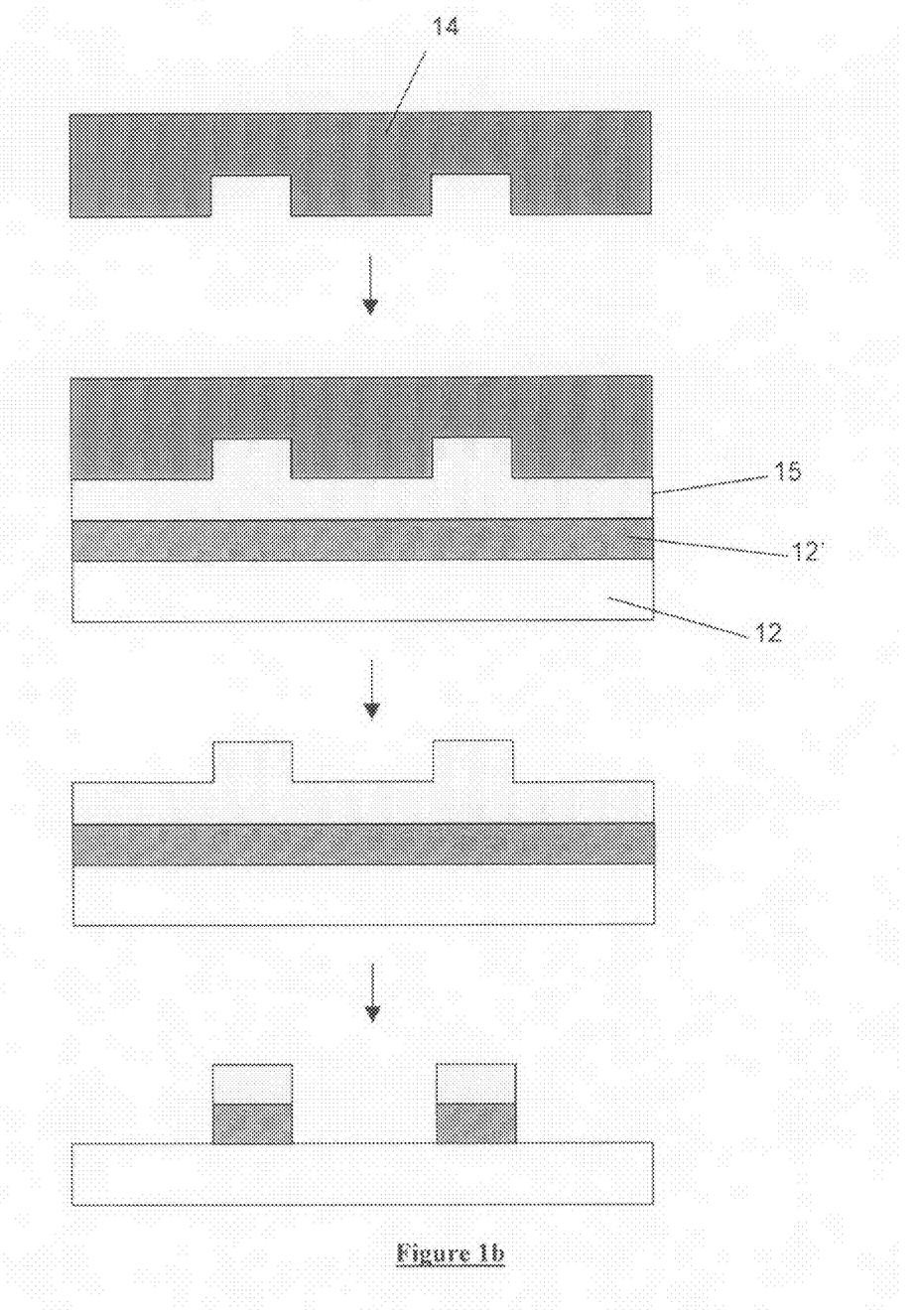
FIG. 1*b* schematically shows an example of hot imprint lithography.

FIG. 1b shows an example of so-called hot imprint lithography (or hot embossing). In a typical hot imprint process, a template 14 is imprinted into a thermosetting or a thermoplastic polymer resin 15, which has been cast on the surface of a substrate 12. The resin may, for example, be spin coated and baked onto the substrate surface or, as in the example illustrated, onto a planarization and transfer layer 12'. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template may then be removed and the patterned resin cooled. In hot imprint lithography employing a layer of thermoplastic polymer resin, the thermoplastic resin is heated so that it is in a freely flowable state immediately prior to imprinting with the template. The thermoplastic resins may be heated to temperatures considerably above the glass transition temperature of the resin. The template is pressed into the flowable resin and then cooled to below its glass transition temperature with the template in place to harden the pattern. Thereafter, the template is removed. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g., U.S. Pat. No. 4,731,155 and U.S. Pat. No. 5,772,905.

Figure 1C:
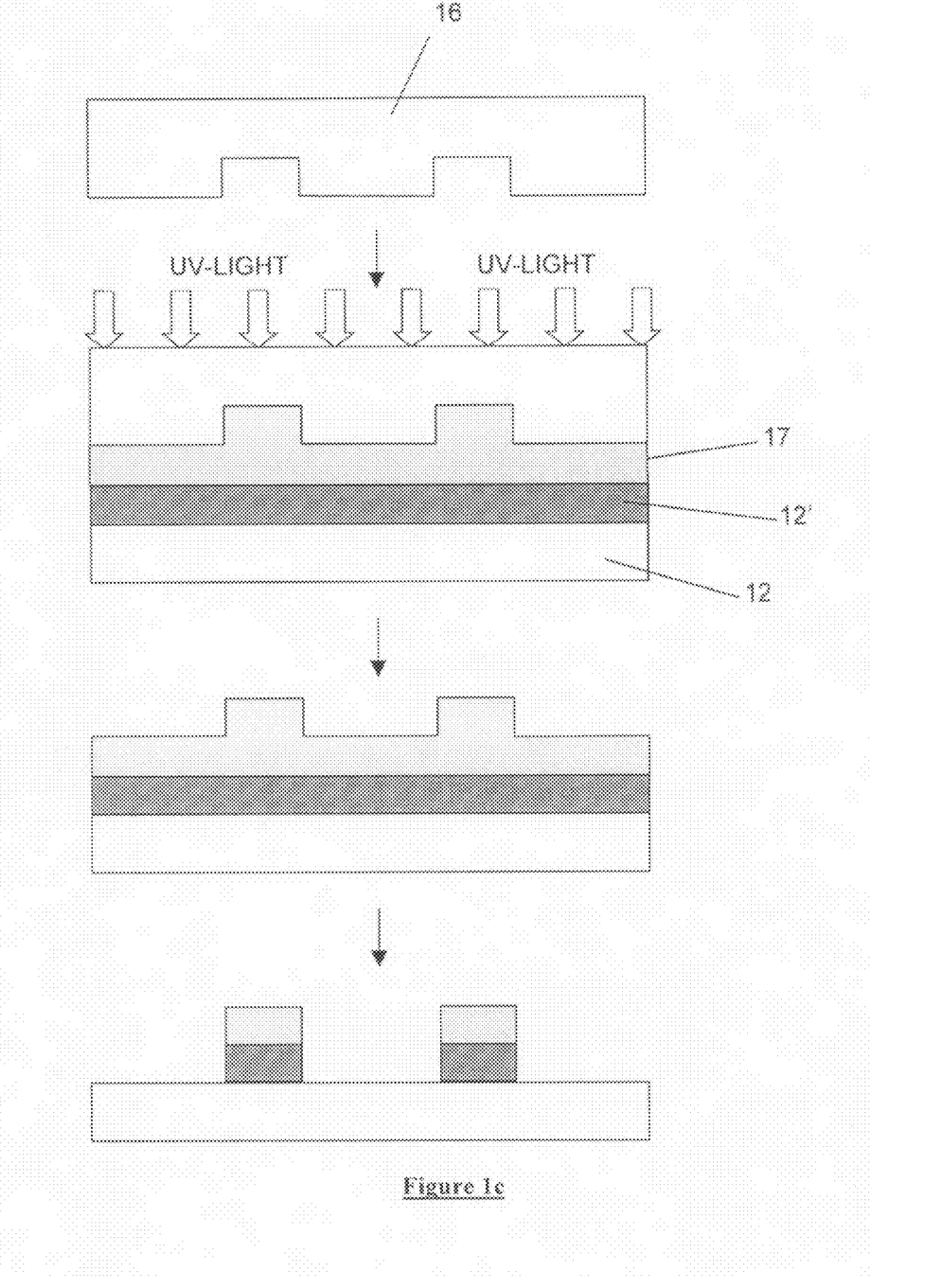
FIG. 1*c* schematically shows an example of UV imprint lithography;.

FIG. 1c shows an example of UV imprint lithography, which involves the use of a transparent template and a UV-curable liquid as resist (the term "UV" is used here for convenience but should be interpreted as including any suitable actinic radiation for curing the resist). UV curable liquids are often less viscous than the thermosetting and thermoplastic resins used in hot imprint lithography and consequently may move much faster to fill template pattern features. A quartz template 16 is applied to a UV-curable resin 17 in a similar manner to the process of FIG. 1b. However, instead of using heat or temperature cycling as in hot imprint, the pattern is frozen by curing the resin with UV light that is applied through the quartz template onto the resin. After removal of the template, the resist is etched such that the areas of the resist not covered by the transferred molecular layer are etched down to the substrate. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g., U.S. Published Application No. 2004-0124566, U.S. Pat. No. 6,334,960, PCT Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are also possible. See, e.g., US Published Application No. 2005-0274693, which mentions a combination of heating and UV curing a resist.

Once an imprintable medium, such as the thermosetting/thermoplastic polymer resin 15 or UV-curable resin 17, has been imprinted, the template has to be released from the medium without damaging the imprinted pattern. Damage can be caused by introduction of stresses within the medium which exceed the strength of the medium. For example, when the direction of the force acting on the template to release it from the medium is not perfectly perpendicular to the surface of the imprinted medium, which is often the case, the template moves sideways, which can damage the cast structures of the imprinted pattern.

Figure 2A:
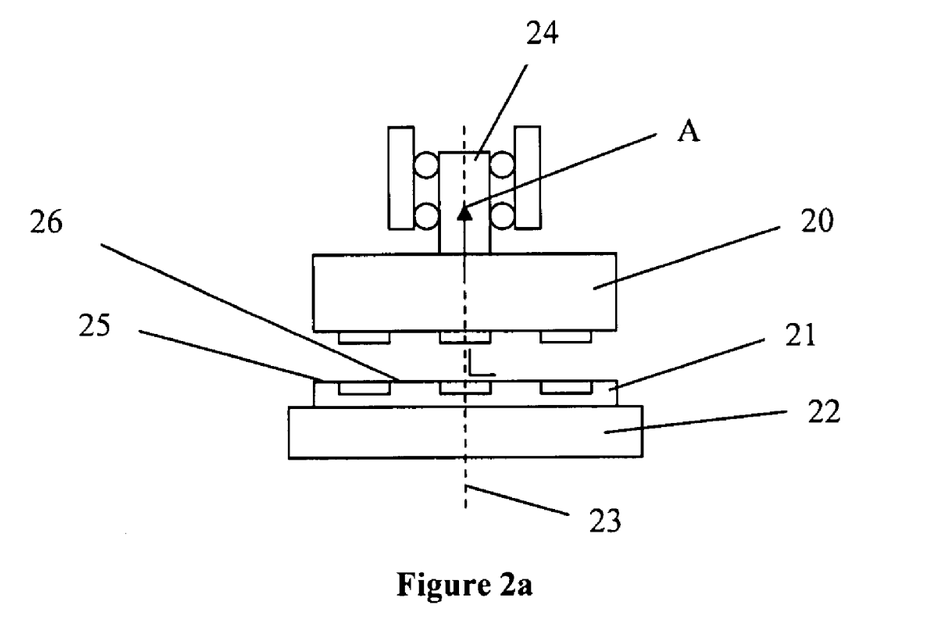
FIG. 2*a* schematically shows an ideal mechanism of release of a template from an imprintable medium following patterning.

FIG. 2a illustrates an idealized mechanism for the release of an imprint template 20 from a patterned imprintable medium 21 supported on a substrate 22. The template 20 is linearly displaced along an imprint axis 23 by an imprint actuator 24 so as to bring the template 20 into contact with the medium 21 to imprint a predetermined pattern and subsequently release the template 20 from the medium 21 in the direction of arrow A. In the idealized situation depicted in FIG. 2, imprint axis 23 is perpendicular to a patterned surface 25 of the medium 21 such that release of the template 20 from the medium 21 does not cause any damage to the cast structures 26 of the patterned medium 21.

Figure 2B:
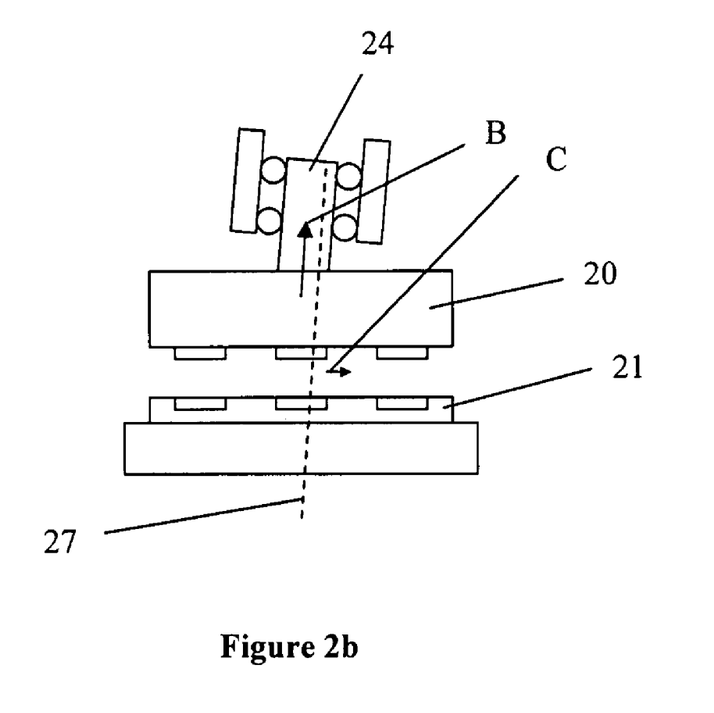
FIG. 2*b* schematically shows a practical mechanism of release of a template from an imprintable medium following patterning.

FIG. 2b depicts the practical mechanism of release of the template 20 from the imprintable medium 21. Typically, in practice, the imprint actuator 24 will not be able to displace the template 20 perfectly linearly along the imprint axis 23 during release of the template 20 from the medium 21. Instead, the actuator 24 will generally displace the template 20 along a release axis 27 which is angularly offset with respect to the imprint axis 23. Consequently, sideways displacement of the template 20 will occur and the template 20 will move in the direction of arrow B during release from the medium 21. Since the template 20 is no longer displaced perpendicularly with respect to the patterned surface 25 of the medium 21, the cast structures 26 of the patterned medium 21 may be damaged.

It is desirable to provide, for example, an imprint lithography apparatus and method which overcome or mitigate a problem associated with the art.

SUMMARY

According to an aspect of the present invention, there is provided an imprint lithography apparatus that includes an imprint template operably connected to an imprint actuator. The imprint actuator is actuatable to displace the template along an imprint axis to bring the template into contact with an imprintable medium. The template is connected to the actuator via a bearing configured to permit substantially unrestricted displacement of the actuator relative to the template along an axis that is substantially perpendicular to the imprint axis during release of the template from the imprintable medium.

According to an aspect of the present invention, there is provided a method of imprint lithography that includes actuating an imprint actuator to displace an imprint template along an imprint axis so as to bring the template into contact with an imprintable medium, and releasing the template from the imprintable medium. The template is connected to the actuator via a bearing configured to permit substantially unrestricted displacement of the actuator relative to the template along an axis that is substantially perpendicular to the imprint axis during release of the template from the imprintable medium.

DETAILED DESCRIPTION

Figure 3:
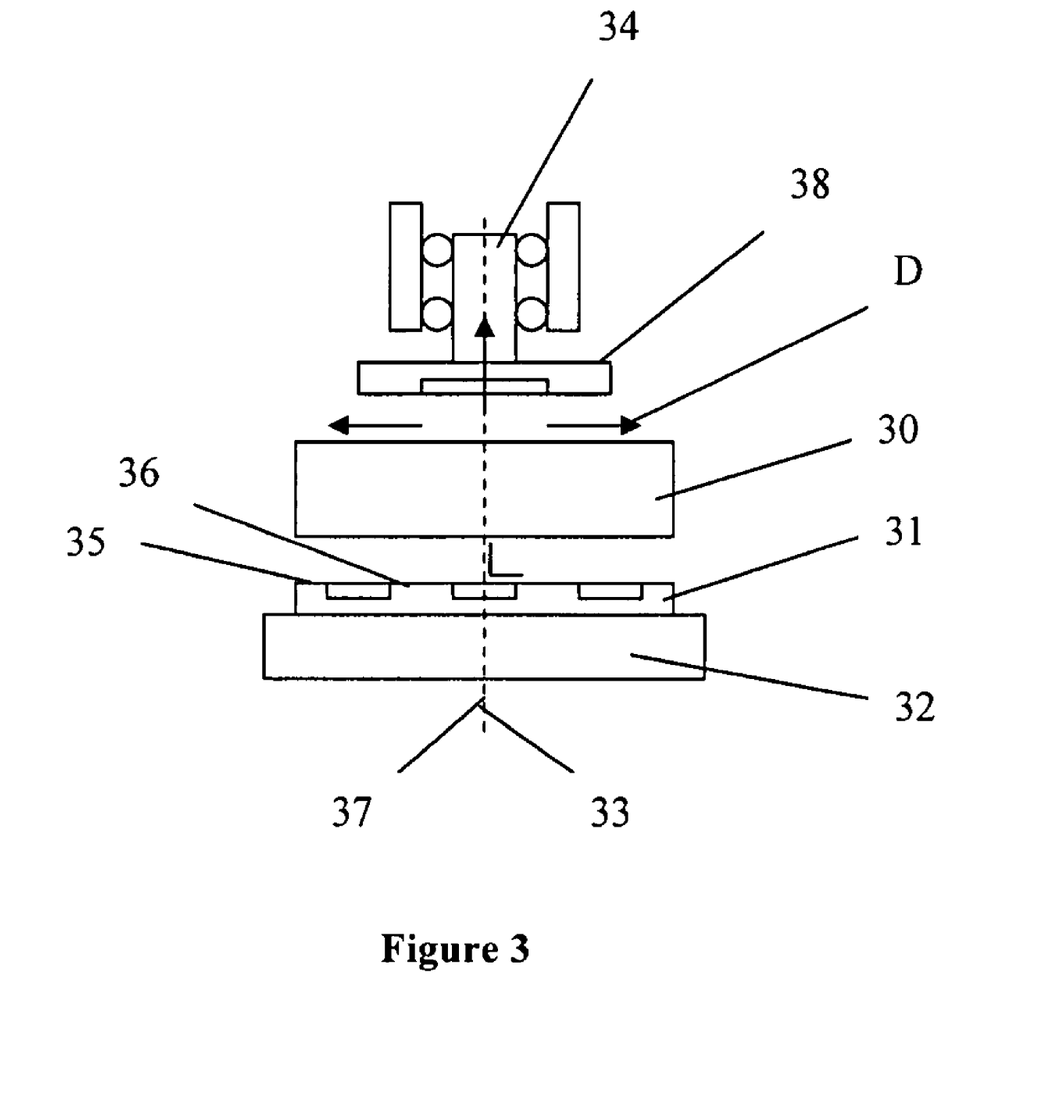
FIG. 3 schematically shows an embodiment of an imprint lithography apparatus during release of the template from the imprintable medium.

FIG. 3 schematically illustrates an imprint lithography apparatus according to an embodiment of the present invention during release of an imprint template 30 from a patterned imprintable medium 31 supported on a substrate 32. In the same way as in the apparatus depicted in FIGS. 2*a* and 2*b*, the template 30 is linearly displaced along an imprint axis 33 by an imprint actuator 34 so as to bring the template 30 into contact with the medium 31 to provide a patterned surface 35 on the medium 31 comprised of cast structures 36. The apparatus depicted in FIG. 3 differs from the apparatus of FIGS. 2*a* and 2*b* in that a vacuum-preloaded air bearing 38 operably connects the actuator 34 to the template 30. The air bearing 38 provides essentially frictionless contact between the actuator 34 and the template 30 and thereby permits substantially unrestricted sideways displacement of the actuator 34 relative to the template 30 in the direction of arrow D during release of the template 30 from the imprintable medium 31. The air bearing 38 is configured to enable the actuator 34 to exert a pulling force to the template 30 linearly along release axis 37, which is coincident with imprint axis 33, without exerting in-plane forces to the template 30. In this way, the actuator 34 delivers force to release the template 30 while the imprintable medium 31 keeps the template 30 in the correct $xyR_z$-position (i.e. in-plane position) until the template 30 is fully released from the medium 31.

Since, after release, the template 30 is not confined in $xyR_z$-direction, position limiters (not shown) are provided to limit sideways displacement of the template 30 relative to the actuator 34.

Sideways displacement of the template 30 may be avoided if the $xyR_z$-location (i.e. in-plane location) of the template 30 is controlled by the imprintable medium 31 rather than the pulling force provided by the actuator 34. To achieve this, $xyR_z$-stiffness (i.e. in-plane stiffness) of the actuator 34 should be as close to zero as possible so that no extra stresses are introduced into the medium 31 during template 30 release.

Figure 4A:
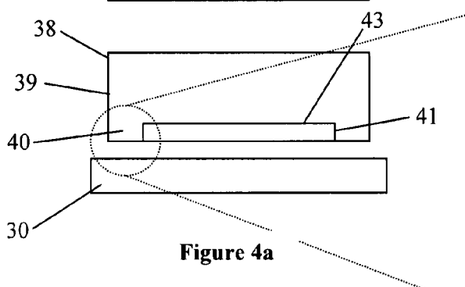
FIGS. 4*a* to 4*d* schematically show more detailed features of the apparatus of FIG. 3.
Figure 4B:
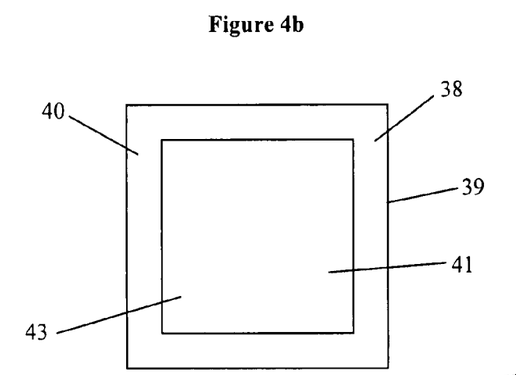

FIGS. 4*a* to 4*d* schematically show details of the structure of the air bearing 38 and the template 30 depicted in FIG. 3. In FIG. 4*a* there is shown a sideways view of the air bearing 38 and the template 30 and FIG. 4*b* provides a plan view of the air bearing 38. The air bearing 38 comprises a high pressure region 40 which surrounds a low pressure region 41.

The term 'high pressure' should be understood to relate to a pressure that is higher then ambient pressure, $p_a$. The term 'low pressure' should be understood to relate to a pressure that is lower than ambient pressure, $p_a$. The low pressure region 41 may be substantially a vacuum.

Figure 4C:
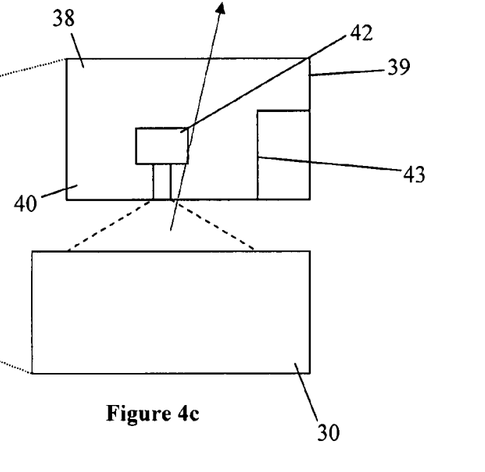

With reference to FIG. 4*c*, the air bearing 38 comprises a housing 39 to which is connected a high pressure channel 42 to supply a high pressure gas, $P_s$, (e.g. air) so as to provide the high pressure region 40. The low pressure region 41 is provided by a supply of a low pressure gas (e.g. air) to an inner recessed section 43 of the housing 39 via a low pressure channel (not shown) connected to the housing 39. The housing 39 may take any convenient size and shape but it may be, for example, around 30 mm wide, and the inner recessed section 43 may be, for example, around 24 mm wide.

Figure 4D:
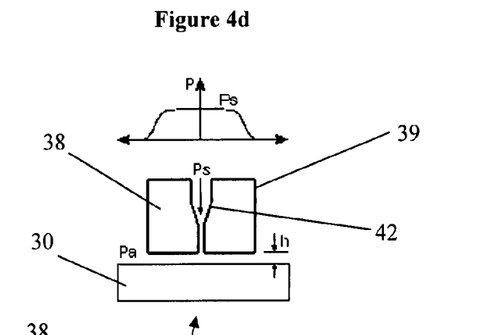

Referring now to FIG. 4*d*, by maintaining a suitable balance between the high and low pressure regions 40, 41 the separation, h, of the air bearing housing 39 from the template 30 can be carefully controlled so as to ensure that the actuator 34 can impart the pulling force on the template 30 and at the same time prevent the housing 39 from directly contacting the template 30.

The bearing load capacity is the maximum load that the bearing can withstand. By way of example only and using the example dimensions for the high and low pressure regions mentioned above, with a supply pressure, $p_s$, of 5 bar, the bearing load capacity is:

$$F = 0.35 \cdot (p_s - p_a) \cdot A = 0.35 \cdot (5 \cdot 10^5 - 1 \cdot 10^5) \cdot ((30 \cdot 10^{-3})^2 - (24 \cdot 10^{-3})^2) = 45.36 \text{ N}$$

Vacuum preload is chosen at 50% of load capacity: 22.68 N. With the given dimensions of the high and low pressure regions, this may be realized by using a vacuum level of 0.6 bar (=0.4 bar underpressure), which is a realistic value that can be obtained from of a central vacuum supply.

Maximum pull force (with safety factor of 2) is (45.36−22.68)/2=11.34 N. This maximum force can be further increased by increasing the preload by decreasing the vacuum pressure. To further decrease the vacuum pressure, a vacuum pump can be used instead of a central vacuum supply. For example, decreasing the vacuum pressure from 0.6 bar to 0.2 bar will increase the preload from 22.68 N to 46.08 N, which allows for a higher maximum pull force. The preload force should not exceed the bearing's load capacity to ensure that the bearing does not touch the template. Moreover, during imprinting, the preload force plus the push force (making the imprint) should not exceed the bearing's load capacity.

In another embodiment, a magnetic bearing is provided in place of or in addition to the air bearing. The magnetic bearing provides a first pair of aligned magnets of same polarity, with one of pair of magnets being associated with each of the actuator and the template. The magnetic bearing is preloaded by a second pair of aligned magnets of opposite polarity, with one of the second pair of magnets being associated with each of the actuator and the template.

Figure 5:
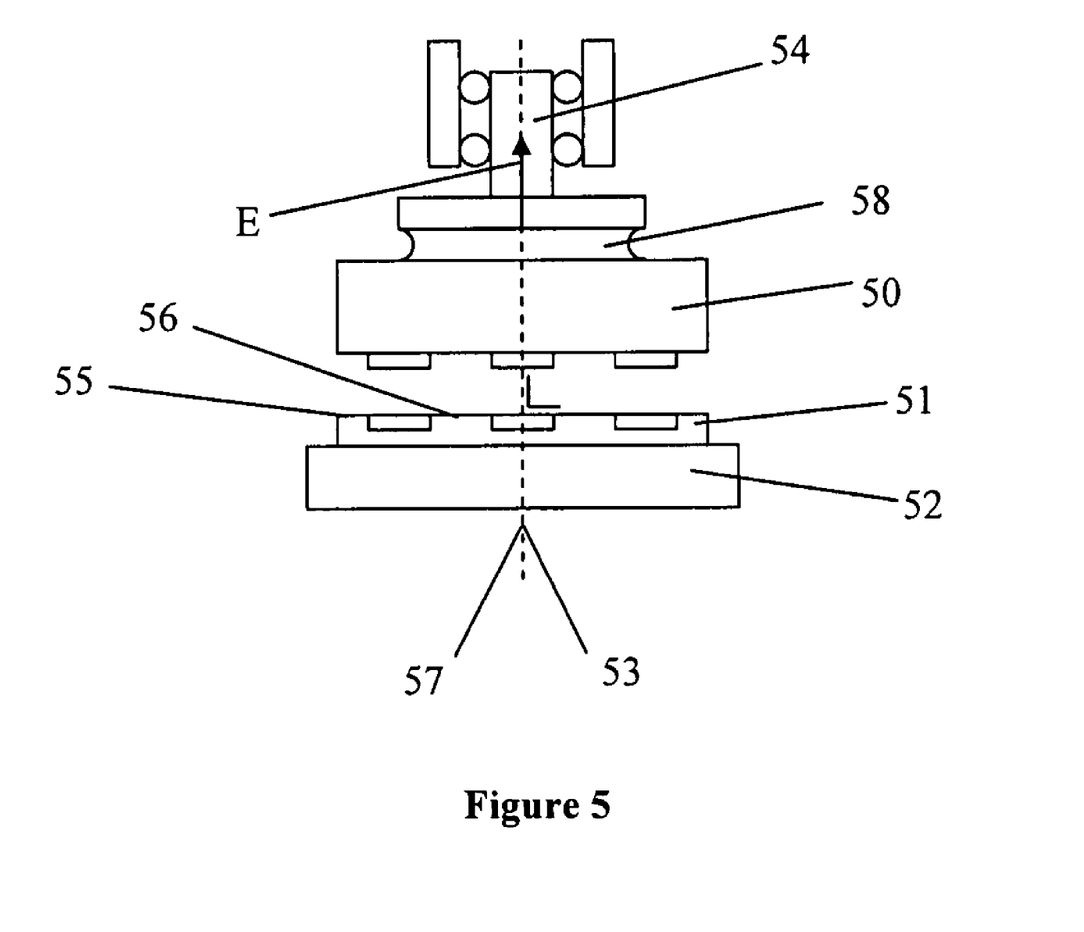
FIG. 5 schematically shows an embodiment of an imprint lithography apparatus during release of the template from the imprintable medium.

FIG. 5 illustrates another embodiment of the imprint lithography apparatus. In the embodiment depicted in FIG. 5, the air bearing 38 of the first embodiment (shown in FIGS. 3 to 4d) is replaced by a fluid film 58 (comprising, for example, water) which again permits substantially unrestricted sideways displacement of an actuator 54 relative to a template 50 during release of the template 50 from an imprintable medium 51 in the direction of arrow E. The medium 51 is supported by a substrate 52. The fluid film 58 has the appropriate physical properties to enable the actuator 54 to pull the template 50 linearly along release axis 57 (coincident with imprint axis 53) without exerting in-plane forces to the template 50, which might otherwise damage the cast structures 56 of the patterned surface 55 of the medium 51. Since, after release, the template 50 is not confined in xyR$_z$-direction, position limiters (not shown) are provided to limit sideways displacement of the template 50 relative to the actuator 54.

It may be desirable, in certain applications, to employ a low pressure, or vacuum, preload (not shown) to the fluid film bearing 58.

Figure 6:
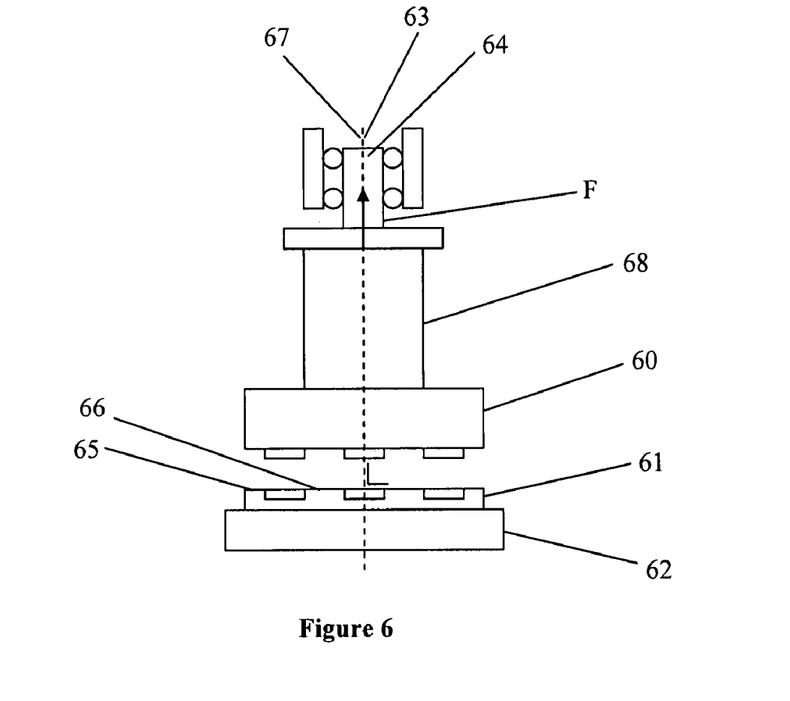
FIG. 6 schematically shows an embodiment of an imprint lithography apparatus during release of the template from the imprintable medium.
Figure 7:
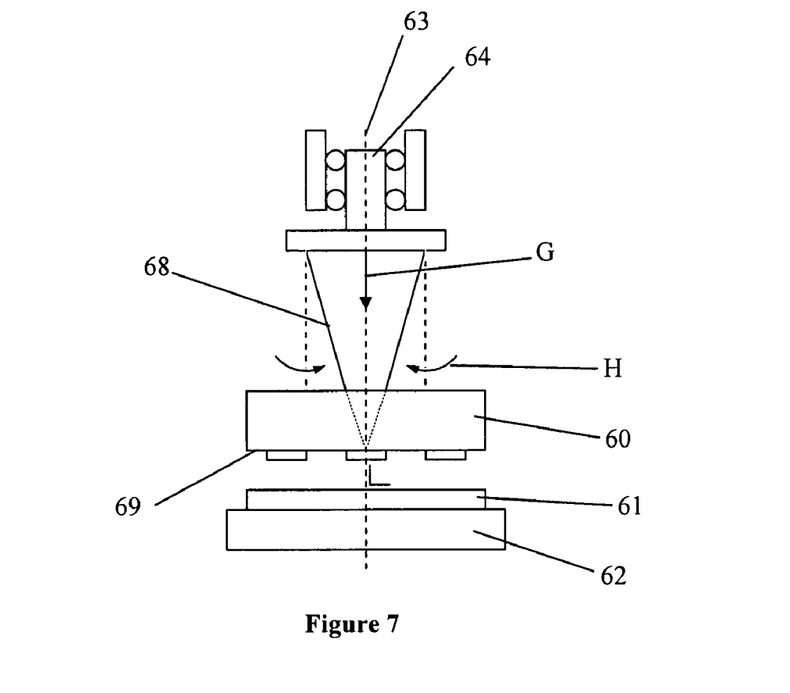
FIG. 7 schematically shows an embodiment of the imprint lithography apparatus of FIG. 6 during displacement of the template towards the imprintable medium.

FIGS. 6 and 7 depict another embodiment of the imprint lithography apparatus. In the embodiment depicted in FIGS. 6 and 7, the air bearing 38 of the first embodiment (shown in FIGS. 3 to 4d) is replaced by biasing means in the form of wire springs 68 (leaf springs or folded leaf springs could also be used) which permit substantially unrestricted sideways displacement of an actuator 64 relative to a template 60 during release of the template 60 from an imprintable medium 61 in the direction of arrow F. The medium 61 is supported by a substrate 62. Once patterned, the medium has a patterned surface 65 that includes cast structures 66. Two wire springs 68 are visible in FIGS. 6 and 7 but it will be appreciated that any appropriate number of wire springs 68 may be used. For example, two, three, four or more wire springs 68 may be used. It is particularly preferred that three wire springs 68 are used.

It will be appreciated that the spring-based bearing 68 may exhibit greater in-plane stiffness than the air bearing 38, and possibly the fluid film bearing 58, but that the in-plane stiffness is still sufficiently low so that, in practice, the actuator 64 is permitted substantially unrestricted sideways displacement relative to the template 60. In-plane stiffness can be further decreased by increasing the length of the wire or leaf springs 68.

FIG. 7 illustrates the apparatus depicted in FIG. 6 during displacement of the template 60 along imprint axis 63 towards the imprintable medium 61 in the direction of arrow G prior to patterning.

In order to achieve template positioning accuracy, the in-plane stiffness of the bearing should be relatively high, in contrast to the low in-plane stiffness that is necessary during template release. Consequently, the in-plane stiffness of the bearing should be switched from very high during template placement, yielding high accuracy, to very low during template release, yielding low stresses within the imprintable medium. For example, when using a gas bearing, as in the embodiment described above, switching stiffnesses can be achieved by reducing or completely switching off the high pressure gas such that the template 30 is clamped to the air bearing 38 by the low pressure (preferably vacuum) preload. When using a spring-based bearing 68, as in the embodiment described above, the relative orientation of the springs 68 can be changed (represented by arrow H) such that they are spaced further apart at their actuator-contacting ends than at their template-contacting ends so as to yield a virtual rotation point at or adjacent to a surface 69 of the template 60 that contacts the imprintable medium 61. In this case, the in-plane stiffness of the bearing 68 is increased while the rotation about x, y or z of the template 60 is kept free, making the template 60 self-orienting with respect to the imprintable medium 61.

It will be appreciated by one of ordinary skill in the art that the above embodiments are presented by way of example only and that various modifications may be made to the above embodiments without departing from the invention, which is defined by the following claims.

What is claimed is:

1. An imprint lithography apparatus comprising an imprint template operably connected to an imprint actuator, said imprint actuator being actuatable to displace the template along an imprint axis to bring the template into contact with an imprintable medium, wherein the template is connected to the actuator via a bearing configured to permit substantially unrestricted displacement of the actuator relative to the template along an axis substantially perpendicular to the imprint axis during release of the template from the imprintable medium.

2. An apparatus according to claim 1, wherein the bearing is a gas bearing.

3. An apparatus according to claim 2, wherein the gas bearing supplies a high pressure gas via a high pressure channel associated with the actuator or the template.

4. An apparatus according to claim 3, wherein the gas bearing is preloaded by a low pressure gas supplied via a low pressure channel associated with the actuator or the template.

5. An apparatus according to claim 4, wherein the high pressure channel and the low pressure channel are both associated with the actuator or the template.

6. An apparatus according to claim 4, wherein the high pressure channel is located closer than the low pressure channel to the periphery of the actuator or the template with which the high pressure channel is associated.

7. An apparatus according to claim 1, further comprising at least one position limiter configured to limit displacement of the actuator relative to the template along the axis substantially perpendicular to the imprint axis after release of the template from the imprintable medium.

8. An apparatus according to claim 1, wherein the bearing is configured to substantially prevent displacement of the actuator relative to the template along the axis substantially perpendicular to the implant axis during displacement of the template along the imprint axis to bring the template into contact with the imprintable medium.

9. An apparatus according to claim 1, wherein the bearing is a magnetic bearing.

10. An apparatus according to claim 9, wherein the magnetic bearing provides a first pair of aligned magnets of same polarity, one of said pair of magnets being associated with each of the actuator and the template.

11. An apparatus according to claim 10, wherein the magnetic bearing is preloaded by a second pair of aligned magnets of opposite polarity, one of said second pair of magnets being associated with each of the actuator and the template.

12. An apparatus according to claim 9, further comprising at least one position limiter configured to limit displacement of the actuator relative to the template along the axis substantially perpendicular to the imprint axis after release of the template from the imprintable medium.

13. An apparatus according to claim 1, wherein the bearing is a fluid film bearing.

14. An apparatus according to claim 13, wherein the fluid is water.

15. An apparatus according to claim 13, further comprising a low pressure channel associated with the actuator or the template to supply a low pressure gas so as to preload the fluid film bearings.

16. An apparatus according to claim 1, wherein the bearing comprises at least one spring selected from the group consisting of a wire spring and a leaf spring.

17. An apparatus according to claim 16, wherein the bearing comprises at least two springs, each spring having a first point of contact with the actuator and a second point of contact with the template, and wherein separation between said first points of contact is substantially similar to separation between said second points of contact during release of the template from the imprintable medium.

18. An apparatus according to claim 16, wherein the bearing comprises at least two springs, each spring having a first point of contact with the actuator and a second point of contact with the template, wherein separation between said joint points of contact is substantially similar to separation between said points of contact during release of the template from the imprintable medium, and wherein separation between first points of contact is greater than separation between second points of contact during displacement of the template along the imprint axis to bring the template into contact with the imprintable medium.

* * * * *